(12) United States Patent
Ishikawa

(10) Patent No.: US 7,623,399 B2
(45) Date of Patent: Nov. 24, 2009

(54) SEMICONDUCTOR MEMORY FOR RELIEVING A DEFECTIVE BIT

(75) Inventor: Katsuya Ishikawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/398,688

(22) Filed: Apr. 6, 2006

(65) Prior Publication Data

US 2007/0103998 A1 May 10, 2007

(30) Foreign Application Priority Data

Aug. 11, 2005 (JP) .............................. 2005-232841

(51) Int. Cl.
*G11C 29/00* (2006.01)
(52) U.S. Cl. ................ 365/200; 365/185.09; 365/210.1
(58) Field of Classification Search ............ 365/185.09, 365/185.2, 200, 210, 210.1
See application file for complete search history.

(56) References Cited

U.S. PATENT DOCUMENTS 5,657,281 A * 8/1997 Rao ............................ 365/200

6,202,180 B1   3/2001  Nose
6,212,118 B1 * 4/2001  Fujita ......................... 365/222
6,414,885 B2   7/2002  Nagamatsu et al.

FOREIGN PATENT DOCUMENTS

| JP | 2-206286 | 8/1990 |
|---|---|---|
| JP | 5-189327 | 7/1993 |
| JP | 11-7761 | 1/1999 |
| JP | 2001-189094 | 7/2001 |
| JP | 57-064395 | 4/2002 |
| JP | 2002-298596 | 10/2002 |

* cited by examiner

*Primary Examiner*—Huan Hoang
*Assistant Examiner*—Jason Lappas
(74) *Attorney, Agent, or Firm*—Arent Fox LLP

(57) ABSTRACT

A semiconductor memory has a memory unit including a regular cell array having a plurality of memory cells and a decoder for decoding an input address and selecting a memory cell corresponding to the input address in the regular cell array, in which an access operation is performed to the selected memory cell; a defective address storage section which stores a defective address corresponding to a defective bit in the regular cell array; and a replacement address storage section which stores a replacement address corresponding to a replacement bit in the regular cell array. When a supply address supplied to the memory unit matches the defective address, the replacement address, in place of the supply address, is supplied to the memory unit as the input address, according to which the access operation is performed.

13 Claims, 15 Drawing Sheets

PRINCIPLE OF THE INVENTION

POSITION OF REPLACEMENT ADDRESS ON IMAGE

FIG. 7A

| | |
|---|---|
| DAdd | 10101010 |
| RAdd | 11111111 |
| EOR1(DAdd,RAdd) | 01010101 |
| SADD | 11110000 |
| EOR2(EOR1,SADD) | 10100101 |

FIG. 7B

| | |
|---|---|
| DAdd | 10101010 |
| RAdd | 11111111 |
| EOR1(DAdd,RAdd) | 01010101 |
| SADD | 10101010 |
| EOR2(EOR1,SADD) | 11111111 |

FIG. 7C

| | |
|---|---|
| DAdd | 10101010 |
| RAdd | 11111111 |
| EOR1(DAdd,RAdd) | 01010101 |
| SADD | 11111111 |
| EOR2(EOR1,SADD) | 10101010 |

FIG. 15 REPLACEMENT ADDRESS AUTOMATIC SETTING OPERATION OF SEVENTH EMBODIMENT

FIG. 16
EXAMPLE OF REPLACEMENT ADDRESS SETTING SEQUENCE
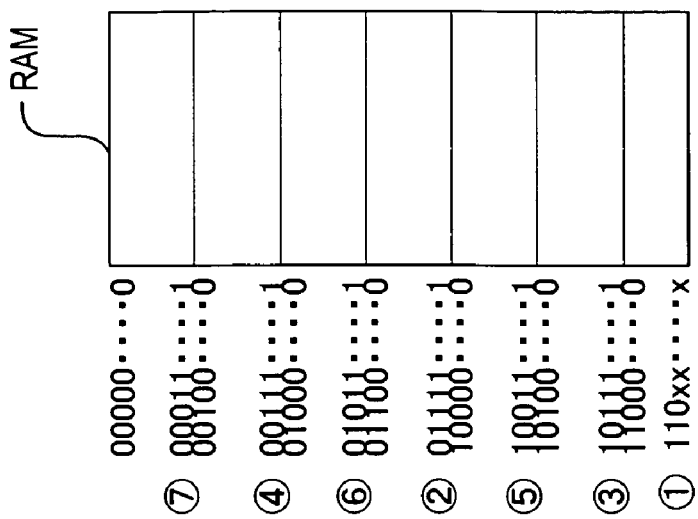
(A) WHEN RAM CAPACITY IS A POWER OF 2
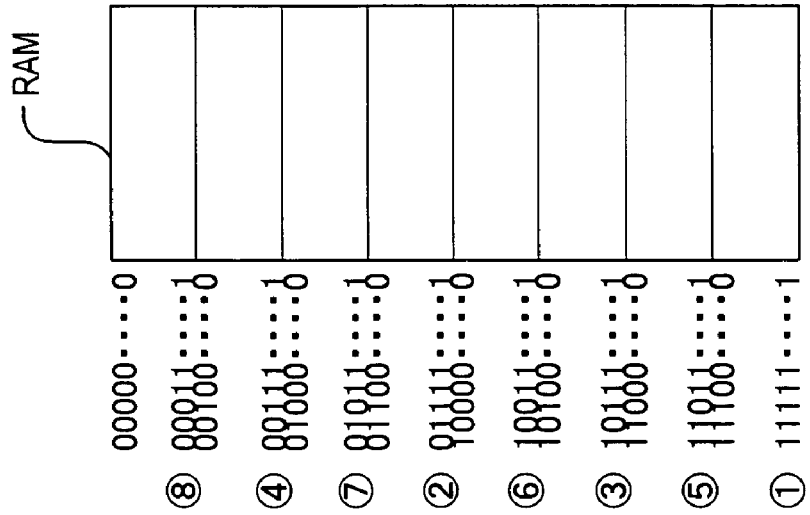
(B) WHEN RAM CAPACITY IS NOT A POWER OF 2

SEMICONDUCTOR MEMORY FOR RELIEVING A DEFECTIVE BIT

CROSS-REFERENCE TO RELATED APPLICATIONS

This application is based upon and claims the benefit of priority from the prior Japanese Patent Application No. 2005-232841, filed on Aug. 11, 2005, the entire contents of which are incorporated herein by reference.

BACKGROUND OF THE INVENTION

1. Field of the Invention

The present invention relates to a semiconductor memory for relieving a defective bit, and more particularly to a semiconductor memory for relieving a defective bit without forming a redundant cell array for relieving a defective bit.

2. Description of the Related Art

A large capacity semiconductor memory has a configuration to relieve a defective bit for improving yield and decreasing price. Specifically a semiconductor memory has a redundant cell array which can replace a defective word or defective column containing a defective bit, in addition to a regular cell array. And if a defective bit is detected in the regular cell array at the operation test, the defective word line or defective column line containing the defective bit is replaced with the word line or column line in the redundant cell array. And the address of the defective bit is stored in the ROM in order to replace the defective bit with the redundant cell. Then it is checked whether the access target address matches with the address of the defective bit in the regular operation, and if a match, the redundant cell is accessed in addition to accessing the defective cell, and the output of the redundant cell is selected and the data of the redundant cell is output. By this, the yield of the semiconductor memory can be improved. This redundant cell array configuration is used not only for DRAM but also for various memories, such as FeRAM and SRAM.

A semiconductor memory having the above mentioned redundant cell array is disclosed in Japanese Patent Application Laid-Open No. S57-64395 and No. 2002-298596, for example.

SUMMARY OF THE INVENTION

A semiconductor memory having a conventional redundant cell array does not have defective bit, but must have a redundant cell array in addition to a regular cell array. Therefore the capacity of the cell array tends to be enormous.

In the case of a large capacity semiconductor memory, on the other hand, a user does not always use all the memory cells, and for most users a part of the memory cells are are not used. Therefore the memory cell of a redundant cell array is replaced with the defective bit in the regular cell array despite the unused area that is available in the regular cell array.

Also in the case of image data, it is not always necessary to accurately store all the data in the memory. For image data in an obscure area, the user has no serious problems even if the data could not be accurately stored in the memory and inaccurate data is read.

With the foregoing in view, it is an object of the present invention to provide a semiconductor memory which can relieve a defective bit without having a redundant cell array.

To achieve the above object, a first aspect of the present invention provides a semiconductor memory comprising: a memory unit including a regular cell array having a plurality of memory cells and a decoder for decoding an input address and selecting a memory cell corresponding to the input address in the regular cell array, in which an access operation is performed to the selected memory cell; a defective address storage section which stores a defective address corresponding to a defective bit in the regular cell array; and a replacement address storage section which stores a replacement address corresponding to a replacement bit in the regular cell array, wherein when a supply address supplied to the memory unit matches the defective address, the replacement address, in place of the supply address, is supplied to the memory unit as the input address, according to which the access operation is performed.

According to the first aspect of the present invention, the memory cell of the replacement address in this regular cell array is accessed when a defective bit in the regular cell array is accessed, so a malfunction due to a defective bit can be prevented.

In the first aspect, it is preferable that when the supply address matches the replacement address, the defective address, in palce of the supply address, is supplied to the memory unit as the input address, according to which the access operation is performed. In other words, the defective address and the replacement address are exchanged, and the defective address is supplied to the memory unit as the input address.

In the first aspect, it is preferable that the replacement address of the replacement target memory cell to be accessed, instead of the defective bit, is selected from the addresses of the memory cells where data, in which the presence of defects is practically allowed based on the data type stored in the semiconductor memory, are stored.

According to the above embodiment, a memory cell, where data in which the presence of defects is practically allowed is stored, is exchanged with the memory cell of the defective bit, and when a defective address is accessed, a memory cell of the replacement address is accessed to make access normal. If the replacement address is accessed, the memory cell of the defective bit is accessed, but the data, which becomes defective by this access, is practically allowed.

It is also preferable that the replacement address of the replacement target memory cell, to be accessed instead of the defective bit, is selected from the addresses of the memory cells where data in the regular cell array is not written. For example, the replacement address is selected from the addresses of the memory cells which were not written when data was downloaded to the semiconductor memory. For this, the semiconductor memory further comprises a replacement address setting unit which monitors an input address to be accessed when a write operation to the semiconductor memory is performed, and set an address where writing has not been performed to be the replacement address. For example, the input addresses to be accessed when data are downloaded to the semiconductor memory are monitored, and the address which has not been accessed is set to the replacement address.

According to the above embodiment, the memory cell not in use in the regular cell array is exchanged with the memory cell of the defective bit, so if a defective address is accessed, the memory cell of the replacement address is accessed to make normal access possible. In the case when all the memory cells in the regular cell array are not in use, this embodiment can effectively relieve the defective bit.

In the first aspect, it is preferable that the memory unit writes or reads a plurality of bits of data corresponding to an input address, and the semiconductor memory further comprises a bit exchange circuit which exchanges a defective bit for a least significant bit, for the write data or read data based on the defective address. According to this, the defective bit is exchanged with the least significant bit, therefore the defective bit is positioned in the least significant bit in the plurality of bits of data, so that the value of the plurality of bits of data does not deviate from the normal value as much as possible.

To achieve the above object, a second aspect of the present invention provides a semiconductor memory comprising: a memory unit including a regular cell array having a plurality of memory cells and a decoder for decoding an input address and selecting a memory cell corresponding to the input address in the regular cell array, in which an access operation is performed to the selected memory cell and a plurality of bits of data are written or read according to the input address; a defective address storage section which stores a defective address corresponding to a defective bit in the regular cell array; and a bit exchange circuit which exchanges a defective bit for a non-defective predetermined bit, such as a least significant bit, for the write data or read data based on the defective address.

According to the second aspect, the defective bit is exchange with a non-defective predetermined bit, such as a least significant bit, therefore the defective bit is positioned in the least significant bit in the plurality of bits of data, so that the value of the plurality of bits of data does not deviate from the normal value as much as possible.

According to the semiconductor memory of the present invention, a defective bit in the regular cell array can be relieved without creating the redundant cell array. Also a step of determining a row or column where a defect exists and a step of relieving the defect by a laser cut, for example, are unnecessary.

BRIEF DESCRIPTION OF THE DRAWINGS

FIG. 7 shows the operation of two sets of EOR groups;

FIG. 16 are diagrams depicting the temporary settings of the replacement address.

DESCRIPTION OF THE PREFERRED EMBODIMENTS

Embodiments of the present invention will now be described with reference to the drawings. The technical scope of the present invention, however, is not limited to these embodiments, but shall extend to matters stated in the Claims and equivalents thereof.

Figure 1:
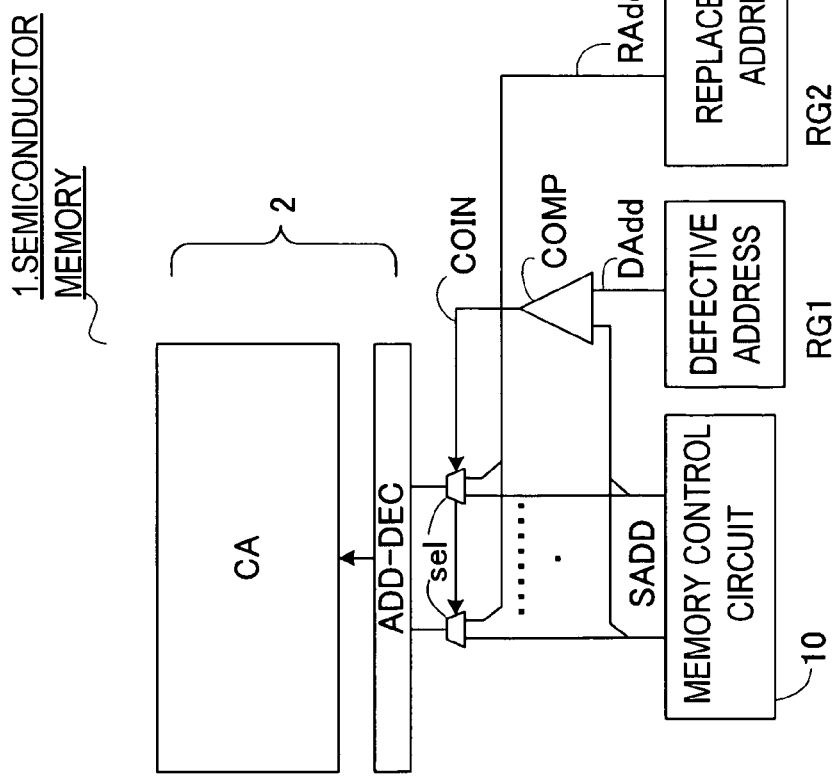
FIG. 1 is a diagram depicting the principle of the present invention.

FIG. 1 is a diagram depicting the present invention. The semiconductor memory 1 comprises a regular cell array CA having a plurality of memory cells, and a decoder ADD-DEC for decoding the input address and selecting a memory cell in the regular cell array CA. The memory control circuit 10 provides a supply address SADD to a memory unit 2 having a regular cell array and decoder, and performs access operation including data write and data read. The semiconductor memory 1 further comprises a defective address register RG1 for storing the defective address DAdd corresponding to the defective bit in the regular cell array, and a replacement address register RG2 for storing a replacement address RAdd to replace the defective address. The comparator COMP compares the supply address SADD and the defective address DAdd, and outputs a coincidence signal COIN if there is a match, and responding to the coincidence signal COIN the selector sel sends the replacement address RAdd, instead of the supply address SADD, to the memory unit. In other words, the defective address is replaced with the replacement address and the replacement address is supplied to the memory unit.

The replacement address RAdd is set to an address in a memory cell in the regular cell array CA for storing data in which the presence of defects is practically allowed. The replacement address RAdd is also set to an address in the regular cell array CA where data is not significant.

Figure 2:
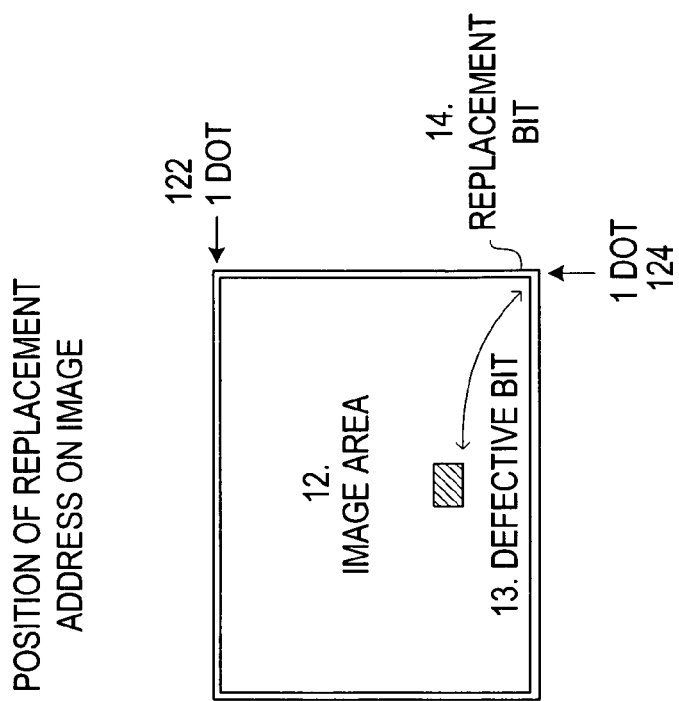
FIG. 2 is a diagram depicting the position of data on the image area corresponding to the replacement address.

FIG. 2 is a diagram depicting a position in a data image area corresponding to the replacement address. FIG. 2 shows an address of the memory cell for storing data in which the presence of defects is practically allowed, as an example of the replacement address. Here the capacity of the image data matches the capacity of the regular cell array, all the memory cells in the regular cell array are in use, and the position on the image data and the position on the regular cell array correspond to each other. In the case when a defective bit 13 exists in a position other than the edges of the image area 12, and if a defect exists in the data stored in the memory because of this defective bit 13, the quality of the image drops due to this defective data. However even if defects exist in edge positions 122 and 124 of the image area 12, the drop of the image quality due to this defective data does not become a serious problem. This is because defects existing in one dot at the edge of the image area do not stand out to human eyes observing the image. It is particularly preferable that the replacement addresses are in one dot at the left and right of the image area, or are at four corners if four or less defects exist. A subtitle, for example, is frequently displayed at the top or bottom of the screen, so image defects are less outstanding at the left and right rather than at the top and bottom.

So in the present embodiment, the replacement address to replace the defective address of the defective bit is set to an address corresponding to the memory cell in the edge area 122 or 124 of the image area 12. And if the defective bit 13 is accessed, the replacement bit 14 in the edge area is accessed instead of the defective bit 13. If the replacement bit 14 is accessed, on the other hand, the defective bit 13 is accessed instead of the replacement bit 14. As a result, the image data in a position, which stands out in the image area 12, is written to the normal replacement bit, instead of the defective bit, and is read from there. The image data in an edge area which does not stand out in the image area 12 is written to the defective bit 13, instead of the replacement bit 14, and is read from there. Therefore defects exist in the image data at the edge area.

For example, in the case of processing such image data as MPEG, the reference image data is temporarily stored in the frame memory. If a semiconductor memory is used as this frame memory, as shown in FIG. 2, the memory cell corresponding to the edge of the image area 12 is set to the replacement target memory cell. The image data at edges has little influence on the drop in image quality even if defects exist there. Therefore even if the memory cell of the defective bit and the replacement target memory cell are exchanged, this is practically acceptable.

For another example, if data cannot be written in all the memory cells of the regular cell array, the address of the memory cell array not in use is set to the replacement address. By this, the defective address of the defective bit and the replacement address are exchanged, and access operation to the defective bit can be performed normally.

An example of the above case is a large capacity memory used as a buffer memory or a work memory. Such a memory has a capacity larger than the necessary volume. Therefore memory cells not in use exist normally. So a memory cell not in use is set to a replacement target memory cell, and the defective address of the defective bit and the replacement address of the replacement target memory cell are replaced, then access operation to the defective bit can be performed normally.

Examples of the memory which has extra memory capacity are an input/output buffer of an MPEG stream, a memory where program code, compressed and stored in ROM, is developed, a memory where variables which constantly change are sequentially stored (variable and address are not corresponded one-to-one), such as a stack memory, and a memory for storing parameters. Another example is a memory having a space area of frame buffers, a space area between an input video data and an input audio data, and an address space which overlaps with the address of a small capacity ROM and an internal or external resource address.

If the operation format of a semiconductor memory is already known in this way, the addresses of the memory cells which are not in use can be known in advance, and these addresses can be set as replacement addresses. A person who integrates the semiconductor memory into a higher system may set appropriate replacement addresses.

Figure 3:
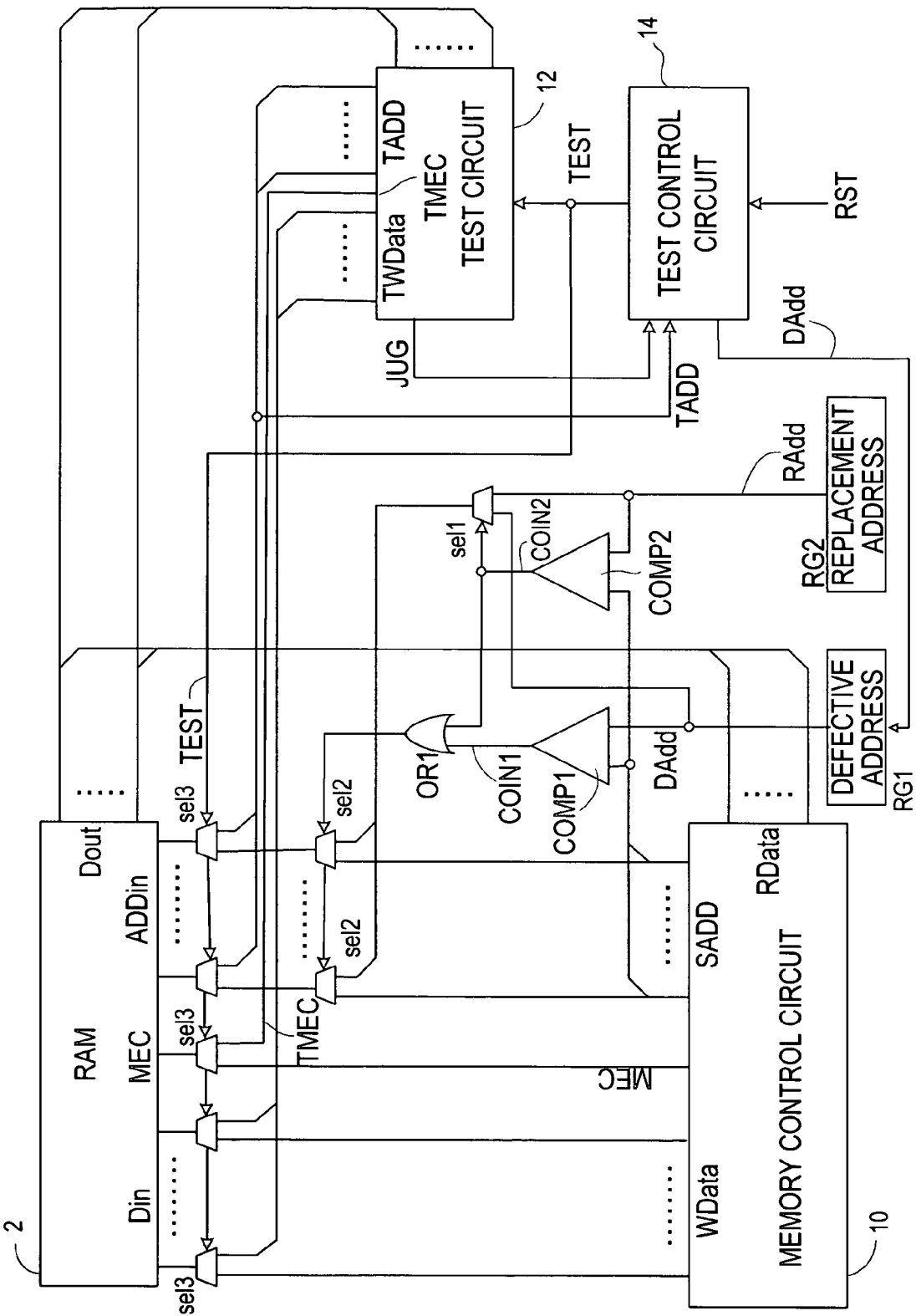
FIG. 3 is a block diagram depicting the semiconductor memory according to the first embodiment.

FIG. 3 is a block diagram depicting the semiconductor memory according to the first embodiment. When an input address ADDin, a memory control signal MEC to instruct writing and an input data Din are supplied, the memory unit 2 writes the input data Din to the memory cell at the input address ADDin. When an input address ADDin and a memory control signal MEC to instruct reading are supplied, the memory unit 2 reads the data Dout from the memory cell at the input address. In this example, the memory unit 2 writes or reads data in a word unit having 8 bits or 32 bits.

The memory control circuit 10 supplies the supply address SADD and the memory control signal MEC to the memory unit 2. In the case of the write operation, the write data WData is also supplied, and the write data WData is input to the memory unit 2 as the input data Din, and the supply address SADD is input to the memory unit 2 as the input address ADDin. In the case of the read operation, the output data Dout is received from the memory unit 2 as the read data RData.

The semiconductor memory further comprises a defective address register RG1 for storing a defective address and a replacement address register RG2 for storing a replacement address. In this example, the semiconductor memory also comprises a test circuit 12 and a test control circuit 14. And in this semiconductor memory, when a reset signal RST is cleared at power ON, the test control circuit 14 outputs a test mode signal TEST to have the test circuit 12 execute an operation test of the memory unit. The test control circuit 14 stores the defective address DAdd of the defective bit detected by this operation test to the defective address register RG1. In the replacement address RAdd, on the other hand, an address of the memory cell, in which the presence of defects is practically allowed, is set based on the operation format of the memory. Therefore in the design stage, the replacement address RAdd is set in the replacement address register RG2.

Responding to the test mode signal TEST, the test circuit 12 generates a test control signal TMEC, a test address TADD and a test write data TWData used for writing. Responding to the test mode signal TEST, the selector group sel3 is switched to the signal from the test circuit 12, and the operation test of the memory unit 2 is performed. The operation test is the same as a general test, where the test circuit 12 writes a predetermined write data TWData while changing the test address TADD from the least significant address to the most significant address, for example, and reads the data Dout while changing the test address TADD in the same way. And the test circuit 12 checks whether the write data and the read data match, and outputs a judgment signal JUG to indicate a match or mismatch. The test control circuit 14 stores the test address TADD when the judgment signal JUG indicates a mismatch, and stores this address in the defective address register RG1 as the defective address DAdd. If a test circuit used for the shipment test can be used for the test circuit 14, then an increase in circuits is minimal.

The semiconductor memory in FIG. 3 comprises a first comparator COMP1 for comparing a supply address SADD and a defective address DAdd, a second comparator COMP2 for comparing the supply address SADD and a replacement address RAdd, a first selector sel1 for selecting one of the defective addresses DAdd and the replacement address RAdd according to the coincidence signal COIN2, and a first selector sel1 for selecting one of the addresses selected by the second selector sel2 and the supply address SADD. And a circuit group comprised of the defective address register RG1, replacement address register RG2, comparators COMP1 and COMP2, the first selector sel1 and OR gate OR1 is provided according to the defective bit. If a plurality of defective bits exist and all these defective addresses are replaced with the replacement addresses, the circuit groups for the number of defective bits are provided.

If the defective address DAdd is set in the test operation at reset, the circuit group replaces the defective address with the replacement address, and provides the replacement address to the memory unit 2 in the regular operation thereafter. In other words, the first comparator COMP1 compares the supply address SADD, which is output by the memory control circuit 10, and the defective address DAdd, and outputs the coincidence signal COIN1 if a match, so as to switch the second selector sel2 from the supply address SADD to the output of the first selector sel1. The second comparator COMP2 compares the supply address SADD, from the memory control circuit 10, and the replacement address RAdd, outputs the coincidence signal COIN2 if a match, so as to switch the first selector sel1 to the defective address DAdd side, and switch the second selector sel2 from the supply address SADD to the output of the first selector sel1. If both the first comparator and the second comparator COMP1 and COMP2 detect a mismatch, then the second selector sel2 selects the supply address SADD, and supplies it to the memory unit 2 as the input address ADDin.

By the two comparators and the selectors sel1 and sel2, the semiconductor memory in FIG. 3 performs the following operation. If the supply address SADD is neither the defective address DAdd nor the replacement address RAdd, the second selector sel2 selects the supply address SADD, and provides the supply address SADD to the memory unit 2 as the input address ADDin, and the memory cell corresponding to the supply address is accessed. If the supply address SADD matches the defective address DAdd, on the other hand, the second selector sel2 selects the replacement address RAdd selected by the first selector sel1, and provides the replacement address to the memory unit 2, and the memory cell corresponding to the replacement address is accessed. And if the supply address SADD matches the replacement address RAdd, the first selector sel1 selects the defective address DAdd, the second selector sel2 selects the defective address DAdd, and the memory cell corresponding to the defective address is accessed.

In other words, the defective address DAdd and the replacement address RAdd are exchanged and provided to the memory unit 2 as the input address ADDin. By this, if the memory control circuit 10 accesses the memory cell of the defective bit, the memory cell of the replacement address is accessed instead, and if the memory control circuit 10 accesses the memory cell of the replacement address, the memory cell of the defective address is accessed instead.

Figure 4:
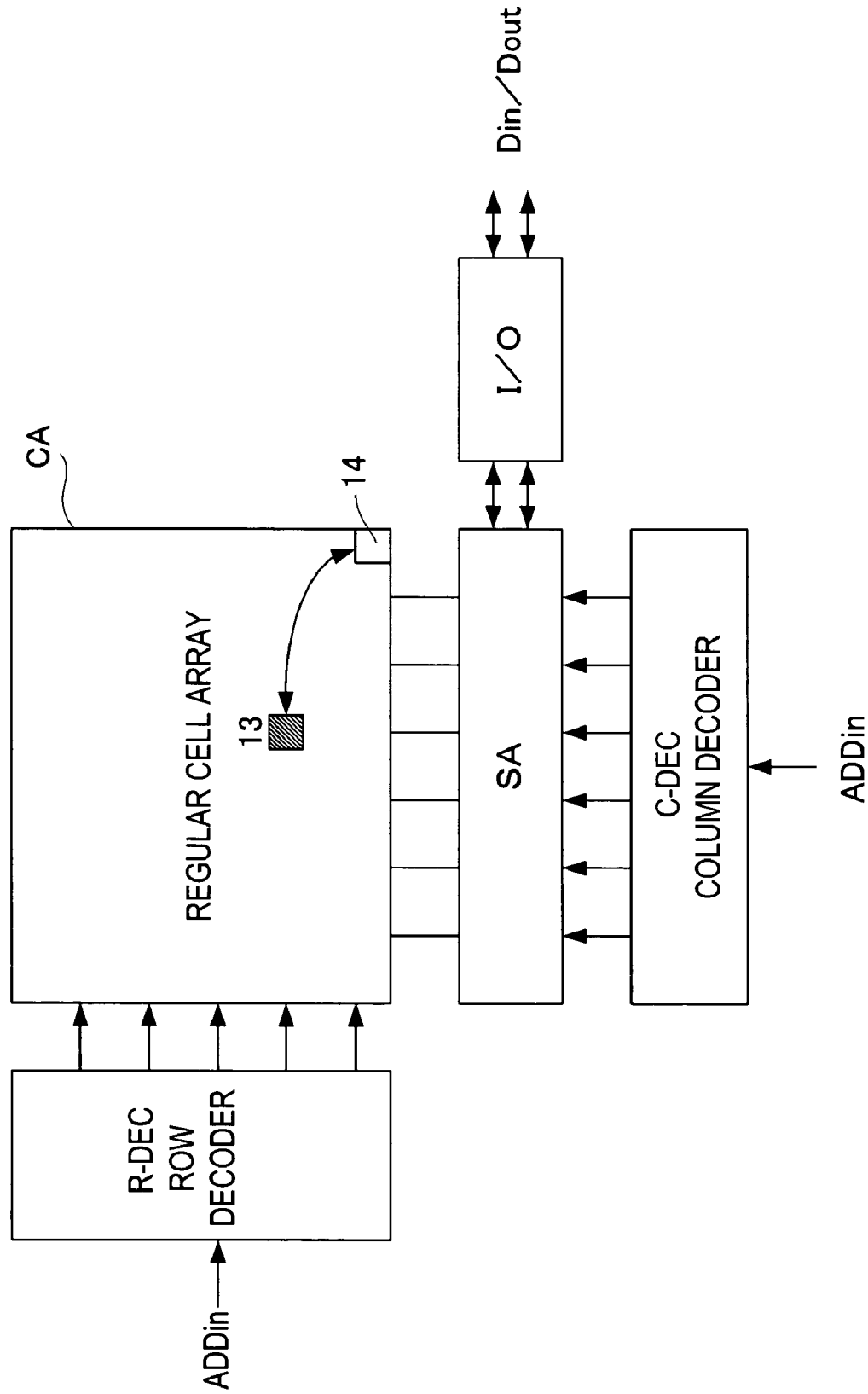
FIG. 4 is a block diagram depicting the memory unit according to the present embodiment.

FIG. 4 is a block diagram depicting the memory unit according to the present embodiment. The memory unit 2 comprises a regular cell array CA, a row decoder R-DEC and a column decoder C-DEC for decoding the input address ADDin, a sense amplifier SA and an input/output circuit I/O. And a redundancy cell array, other than the regular cell array, is not installed, and the defective bit 13 is replaced with the replacement bit 14 in the regular cell array.

Figure 5:
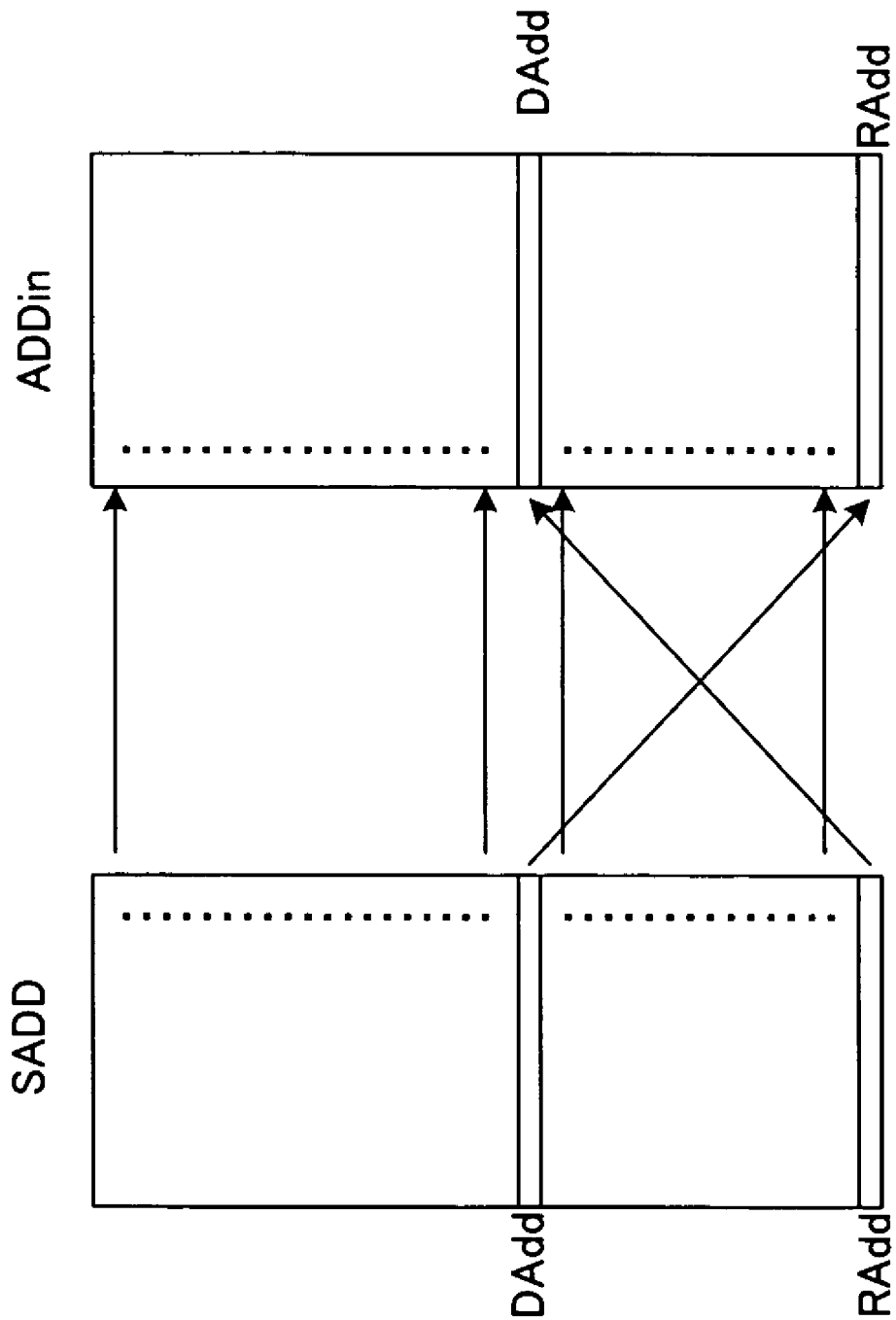
FIG. 5 is a diagram depicting the relationship between the supply address SADD and the input address ADDin to the memory unit.

FIG. 5 is a diagram depicting the relationship between the supply address SADD and the input address ADDin to the memory unit. As FIG. 4 and FIG. 5 show, the replacement bit 14 is accessed instead of the defective bit 13 in the regular cell array, and the defective bit 13 is accessed instead of the replacement bit 14. Specifically, as FIG. 5 shows, the defective address DAdd and the replacement address RAdd are exchanged and provided to the memory unit 2 as the input address ADDin. As a result, access to the defective bit 13 is actually performed to the normal replacement bit 14, so a data defect is not generated. Access to the replacement bit 14, on the other hand, is actually performed to the defective bit 13, but the replacement bit 14 is set at a position where a defect is practically allowed, so a data defect which may be generated is practically allowed and does not cause a problem.

As described above, according to the first embodiment, data is written to all the memory cells in the regular cell array, but the memory cell at the position in which a defect is practically allowed is specified to the replacement bit, and is replaced with the defective bit. In other words, the defective address and the replacement address are exchanged so as to prevent a data defect due to the defective bit from practically becoming a problem.

Figure 6:
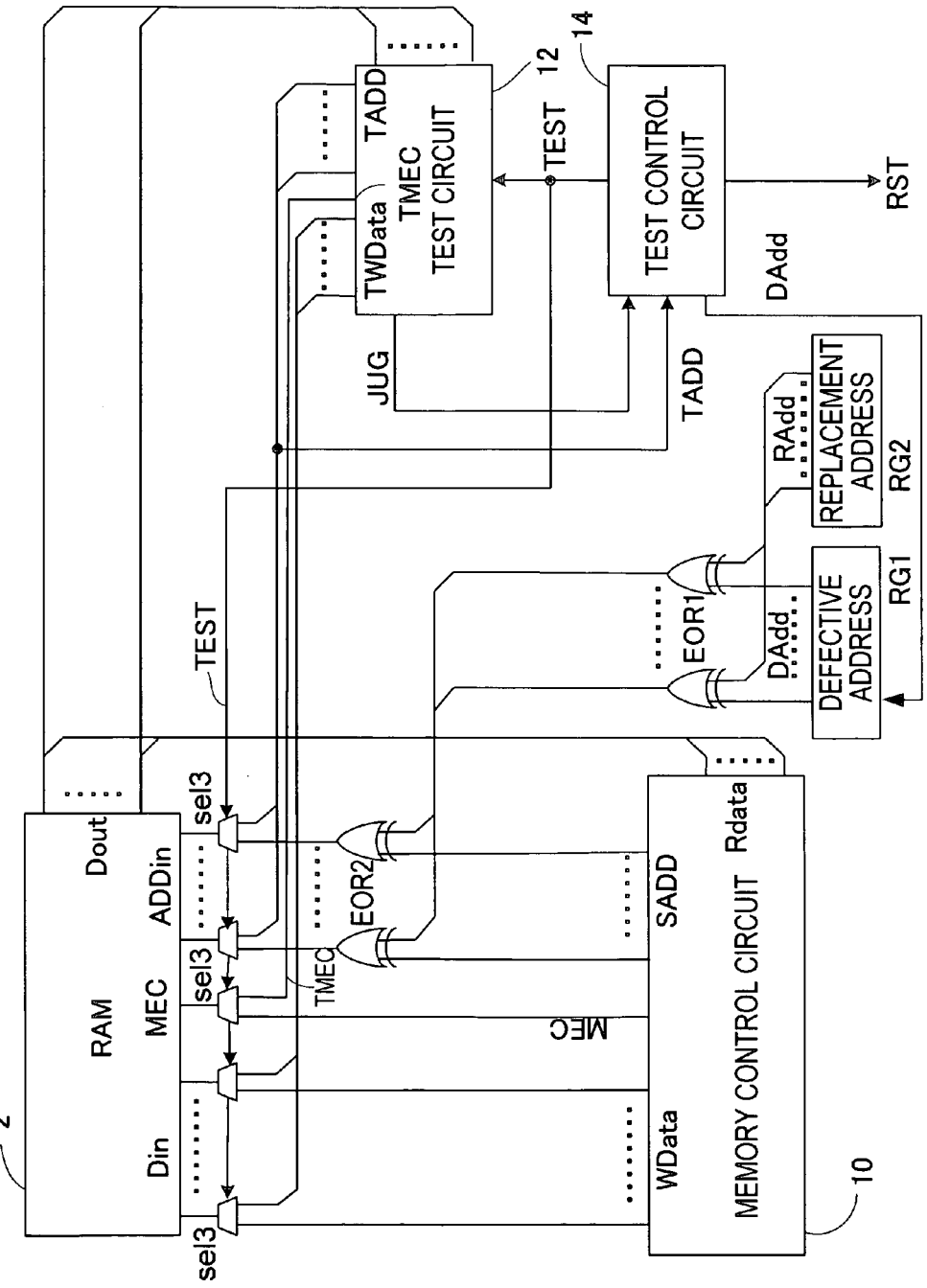
FIG. 6 is a block diagram depicting the semiconductor memory according to the second embodiment.

FIG. 6 is a block diagram depicting the semiconductor memory according to the second embodiment. In FIG. 6, the same reference numbers as FIG. 3 are used. In the case of the example in FIG. 6, the defective address DAdd and the replacement address RAdd are exchanged by two sets of EOR groups EOR1 and EOR2. In other words, instead of the first and second comparators and the first and second selectors in the first embodiment, two sets of EOR groups are installed so as to simplify the circuit configuration. However only one defective address DAdd can be replaced. The other operations of the memory unit 2, memory control circuit 10, internal test circuit 12 and test control circuit 14 are the same as the first embodiment.

FIG. 7A-7C show the operation of the two sets of EOR groups. In the first EOR group EOR1, the exclusive OR of the defective address DAdd and the replacement address RAdd is determined, the exclusive OR of the output thereof and the supply address SADD is determined by the second EOR group EOR2, and is supplied to the memory unit 2 via the third selector sel3. By these two exclusive OR operations, the output of the second EOR group EOR2 becomes the same as the output of the second selector sel2 in the first embodiment. In other words, the output of the second EOR group 2 becomes an address other than the defective address or replacement address converted from the supply address SADD if the supply address SADD does not match either the defective address DAdd or the replacement address RAdd, and becomes the replacement address RAdd if the supply address SADD matches the defective address DAdd, and becomes the defective address DAdd if the supply address SADD matches the replacement address RAdd.

FIG. 7A is a case when the supply address SADD matches neither the defective address nor the replacement address, and in this case, the supply address SADD becomes an address converted based on the exclusive OR EOR1 of the defective and replacement addresses. This converted address matches neither the defective address nor the replacement address. FIG. 7B shows the logical operation result of the first and second EOR groups EOR1 and EOR2 when SADD=DAdd. The operation result is EOR2=RAdd. FIG. 7c shows the logical operation when SADD=RAdd. The operation result is EOR2=DAdd.

As described above, if only one set of a defective address is required, the defective address and the replacement address are exchanged by the two sets of exclusive OR circuits. In this case, the critical path, until the input address ADDin is defined, becomes shorter and the delay time becomes shorter than using the comparator and selector as in the case of the first embodiment, so high-speed operation is possible.

Figure 8:
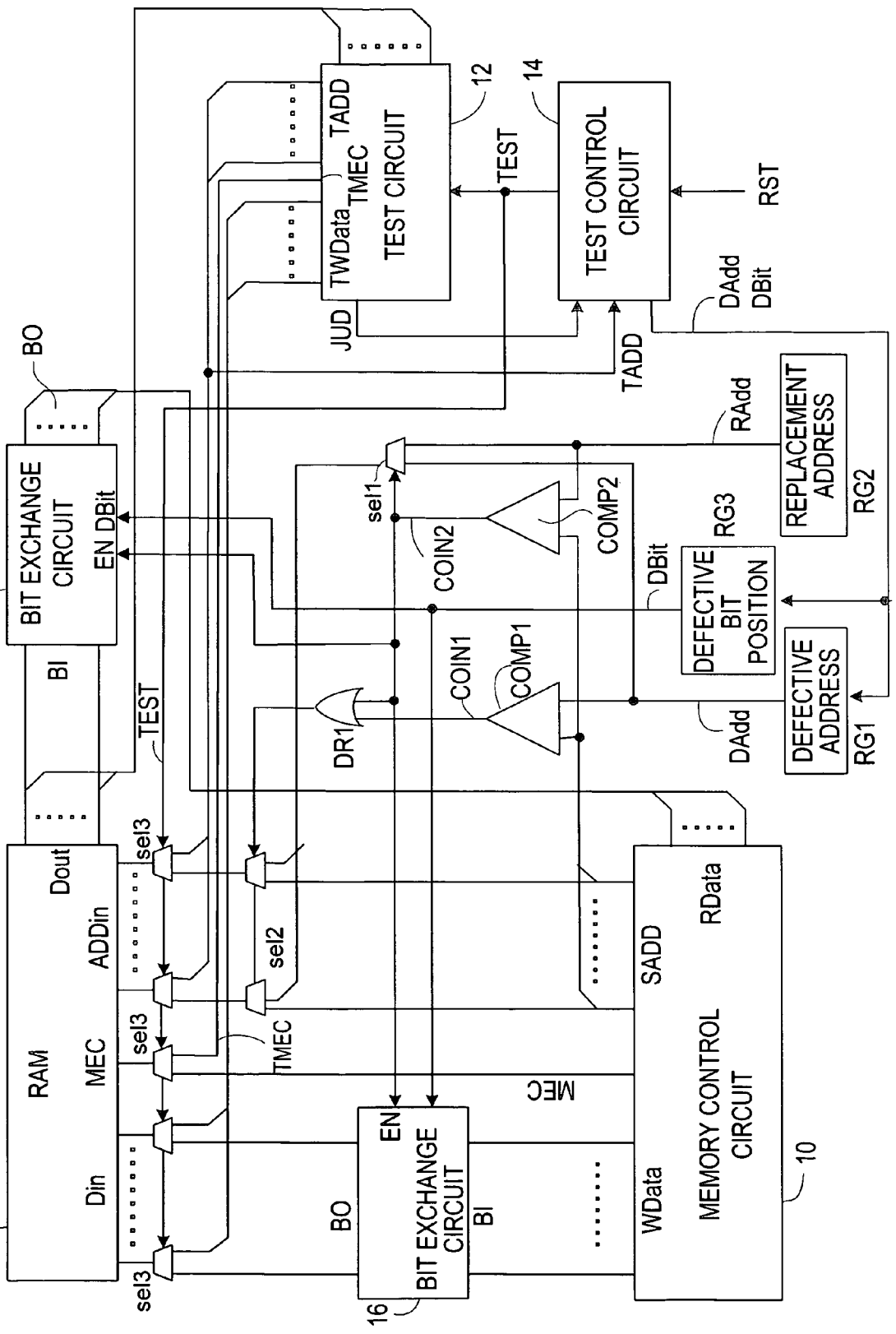
FIG. 8 is a block diagram depicting the semiconductor memory according to the third embodiment.

FIG. 8 is a block diagram depicting the semiconductor memory according to the third embodiment. This example is the first embodiment in FIG. 3, further comprising a bit exchange circuit 16 for exchanging the defective bits out of the plurality of bits of data WData to be written to the defective address with another bit, such as the least significant bit, and a bit exchange circuit 18 for exchanging the defective bit out of the plurality of bits of data Dout to be read from the defective address with another bit, such as the least significant bit. Because of this, the defective bit position register RG3 for storing the defective bit position information is installed, and the test control circuit 14 writes the defective bit position information DBit to the register RG3 based on the test result. It is very rare that a plurality of defective bits exist in a plurality of memory cells corresponding to one address, so replacing a single defective bit with the least significant bit is effective to minimizing the degree of a defect. If two defective bits are detected these defective bits may be replaced with, the least significant bit and the next least significant bit.

According to the third embodiment, if the supply address SADD matches the replacement address RAdd, the second comparator COMP2 outputs the coincidence signal COIN2, and the defective address RAdd is supplied to the memory unit 2 via the selectors sel1 and sel2. If data is written to the defective address, however, the data in the defective bit becomes defective. The replacement address RAdd is set at a position in which a defect is practically allowed, but it is preferable to minimize the defects of the data. So if a defective address is accessed instead of the replacement address, the bit exchange circuits 16 and 18 exchange the defective bit and the least significant bit for the write data and the read data. In the case of a gradation data comprised of a plurality of bits, such as image data, the defect of the gradation data would be a 1/256 error at most if the data is 8 bit data, even if a defect exists in the least significant bit. As the defective bit is higher than the least significant bit, the error thereof increases. Therefore by replacing the defective bit with a predetermined bit which can minimize the degree of a defect, such as the least significant bit, influence by the defective bit can be minimized.

In the specific operation, if the second comparator COMP2 detects a match, the coincidence signal COIN2 is supplied to the bit exchange circuits 16 and 18 as an enable signal EN, and the operation of the bit exchange circuits 16 and 18 are enabled. The defective bit position information DBit is also supplied to the bit exchange circuits 16 and 18. By this, the defective bit of the input data BI of a plurality of bits to be input respectively is replaced with a predetermined bit, preferably the least significant bit, and is output as the output data BO.

Figure 9:
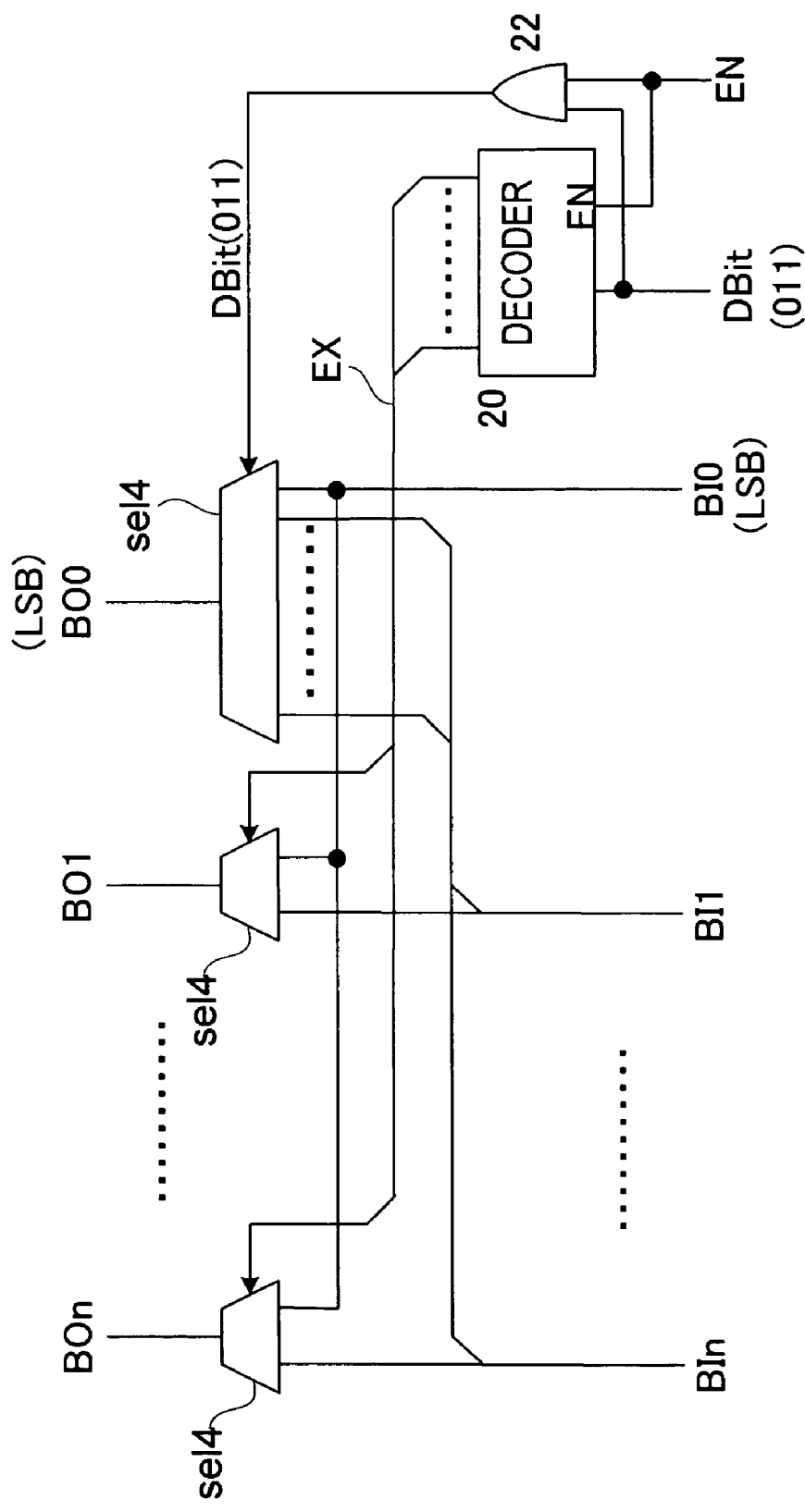
FIG. 9 is a block diagram depicting the bit exchange circuit.

FIG. 9 is a block diagram depicting the bit exchange circuit. The bit exchange circuit 16 or 18 comprises a fourth selector group sel4 for exchanging the defective bit out of the n+1 bits of input data BI0-BIn with the least significant bit LSB, a decoder 20 for decoding the defective bit position information DBit in enable status, and an AND gate 22. The decoder 20 decodes the defective bit information DBit, generates the bit exchange signal EX corresponding to the plurality of bits of input and output data, and supplies it to the selector sel4 corresponding to a bit other than the least significant bit as the select signal. The AND gate 22, on the other hand, supplies the defective bit information DBit to the selector sel4 corresponding to the least significant bit in enabled status. The selector sel4 at the least significant bit selects the input data specified by the defective bit information DBit and outputs it as the least significant output bit BO0. When the enable signal EN is in L level, all output of the AND gate becomes "0", and the selector sel4 at the least significant bit selects the least significant input bit BI0. In other words, when the enable signal EN is in H level, the input data at the defective data is exchanged with the input data at the least significant bit according to the defective bit information DBit.

Figure 10:
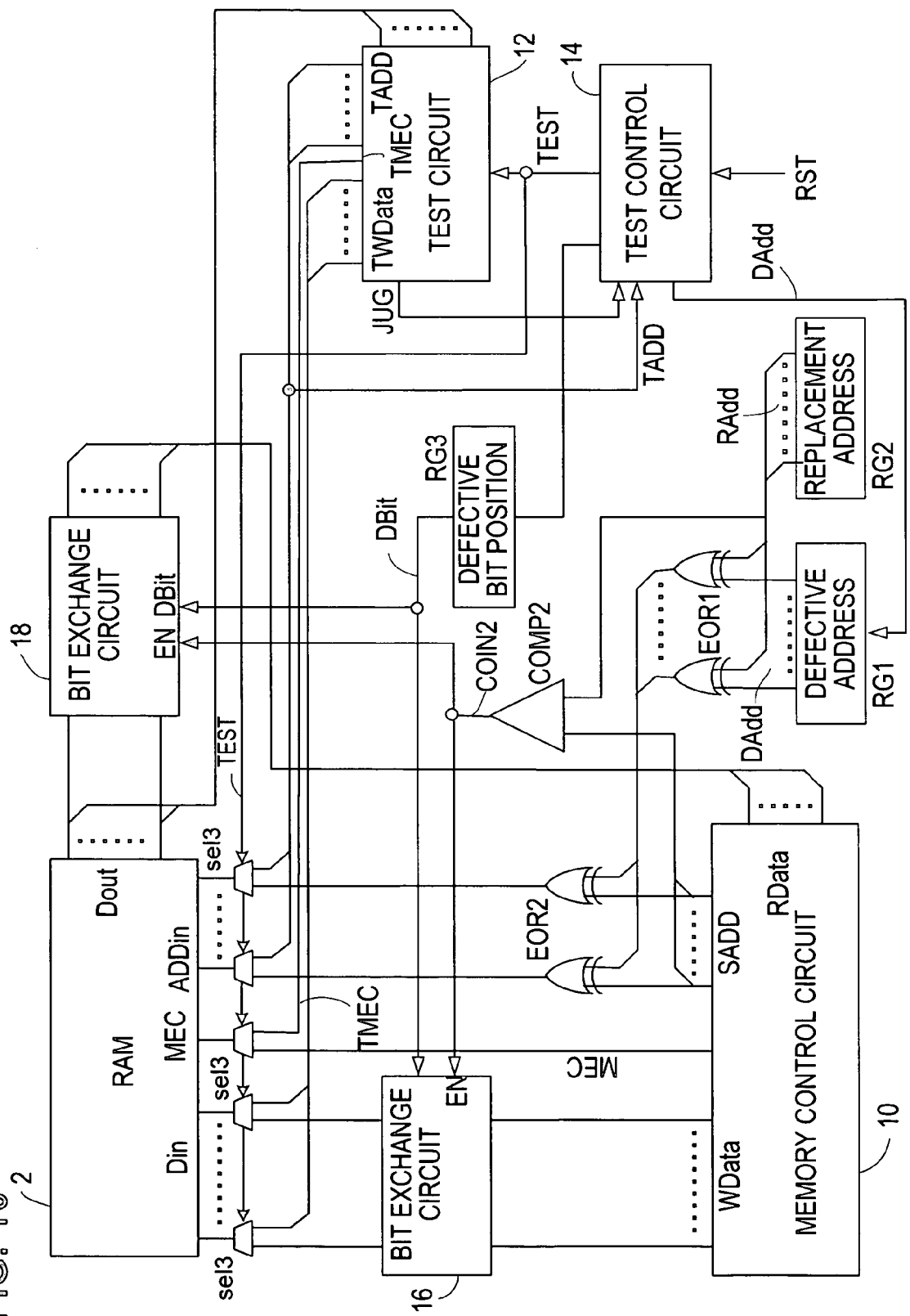
FIG. 10 is a block diagram depicting the semiconductor memory according to the fourth embodiment.

FIG. 10 is a block diagram depicting the semiconductor memory according to the fourth embodiment. This example is the third embodiment in FIG. 8 that is applied to the second embodiment in FIG. 6. In other words, the defective address DAdd and the replacement address RAdd are exchanged by the two sets of EOR groups EOR1 and EOR2, and the defective bit and the least significant bit, for the data to the defective address, are exchanged by the bit exchange circuits 16 and 18. Since two sets of EOR groups are provided, the second comparator COMP2 monitors whether the supply address SADD and the replacement address RAdd match, and when they match the coincidence signal COIN2 is supplied to the bit exchange circuits 16 and 18 as the enable signal EN. Also the defective bit position register RG3 is installed for storing the defective bit position information DBit, which the test control circuit 14 detected based on the test result, to the register RG3. This defective bit position information DBit is supplied to the bit exchange circuit 16 and 18. The configuration of the bit exchange circuit is as shown in FIG. 9.

In the fourth embodiment as well, if the memory control circuit 10 attempts to access the replacement address, the defective address DAdd is supplied to the memory unit 2 as the input address ADDin, and the defective bit is accessed. However when the defective address including the defective bit is accessed, the defective bit of the data comprised of a plurality of bits is exchanged with the least significant bit. Therefore the influence of a defect on data, due to accessing the defective address, can be minimized.

Figure 11:
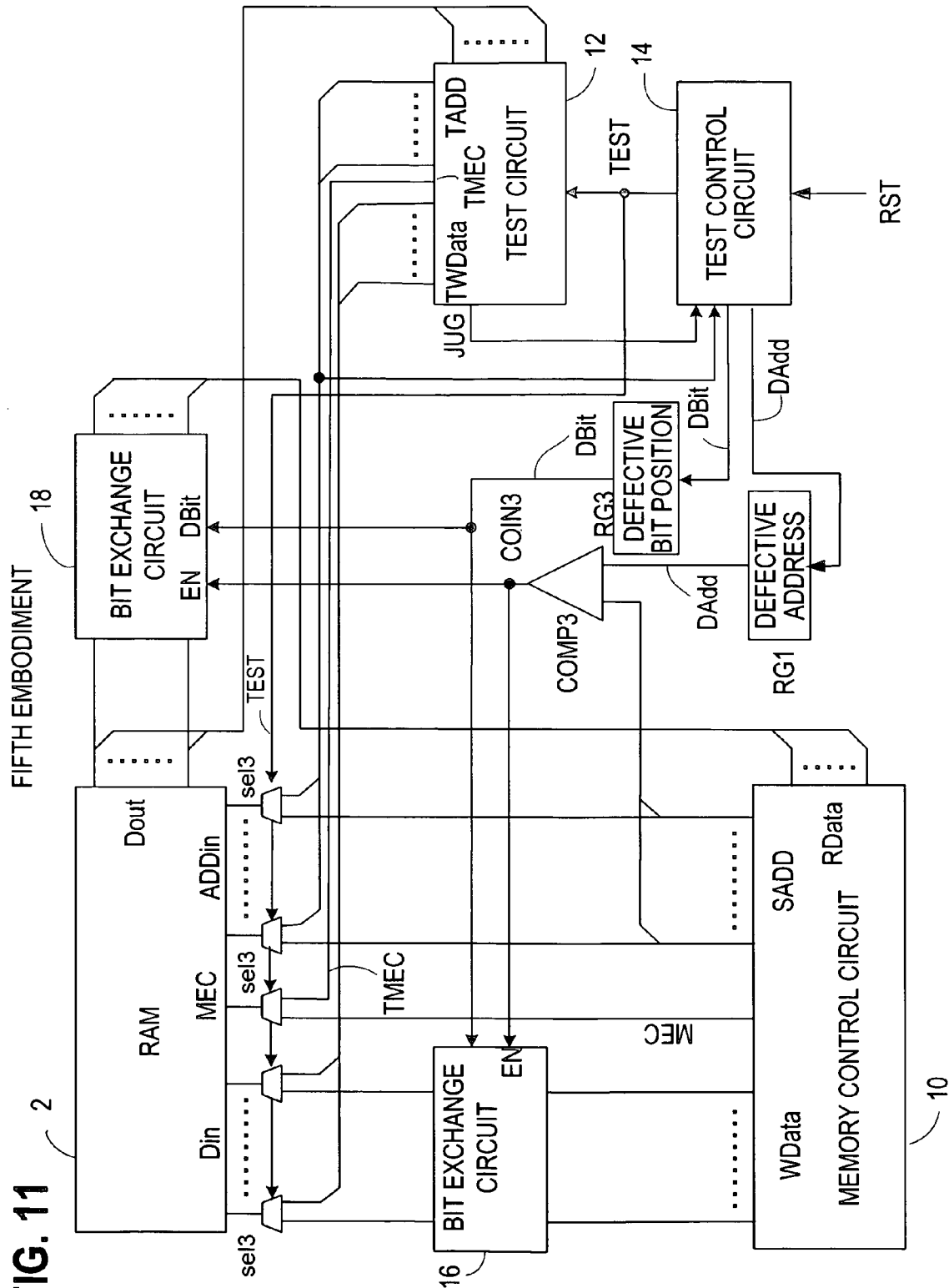
FIG. 11 is a block diagram depicting the semiconductor memory according to the fifth embodiment.

FIG. 11 is a block diagram depicting the semiconductor memory according to the fifth embodiment. In this semiconductor memory, the enclosed test circuit 12 performs an operation test of the memory unit 2 and detects a defective bit, a defective address DAdd corresponding to the defective bit is stored in the register RG1, and the defective bit position information DBit of a plurality of memory cells corresponding to the defective address are stored in the register RG3 respectively, and if the defective address is accessed, the bit exchange circuits 16 and 18 exchange the defective bit and the non-defective predetermined bit, such as the least significant bit. However the defective address and the replacement address are not replaced, unlike the first to fourth embodiments.

Therefore in this embodiment, even if a defective bit is detected, the access operation to that defective bit is executed. However in the case of storing a plurality of bits of data (e.g. one word data) to the address corresponding to the defective bit, the defective bit out of the plurality of bits is exchanged with the non-defective bit, such as the least significant bit, so as to minimize the degree of a defect of the stored data. The bit exchange of the defective bit is performed for both the write data and the read data.

As FIG. 11 shows, the third comparator COMP3 for comparing the supply address SADD and the defective address DAdd is provided, and if this comparator detects a match of these addresses, the coincidence signal COIN3 asserted to H level is supplied to the bit exchange circuits 16 and 18 as the enable signal EN. The bit exchange circuits 16 and 18 have the configuration shown in FIG. 9, where the defective bit corresponding to the defective bit position information DBit of the defective bit position register RG3 is exchanged with the least significant bit.

The bit exchange circuit 18 may perform the bit exchange for the read data Dout, and fix the least significant bit of the bit-exchanged data either to "1" or "0" by clipping. In this case, the degree of a defect by the least significant bit can be controlled to an expected range.

Figure 12:
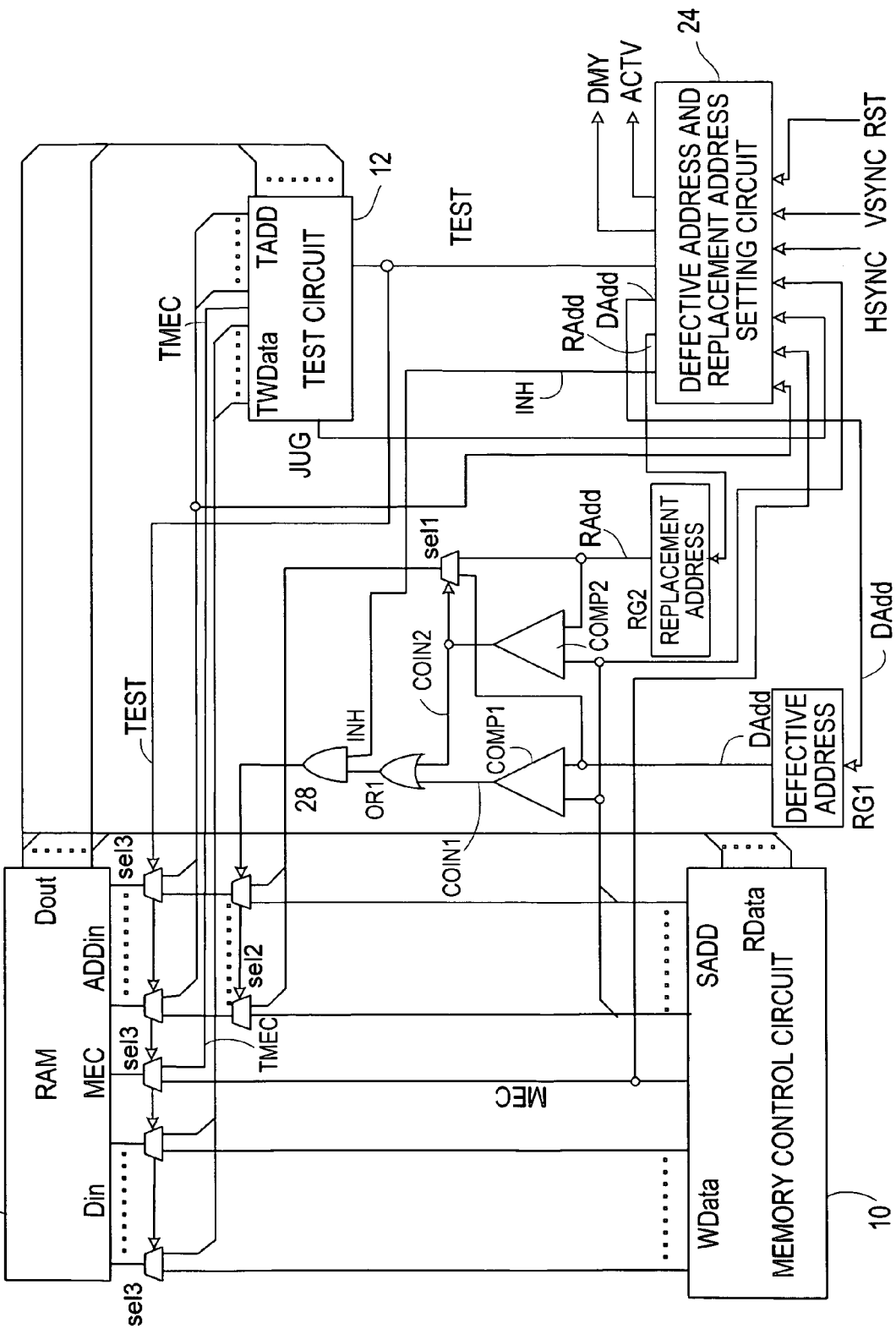
FIG. 12 is a block diagram depicting the semiconductor memory according to the sixth embodiment.

FIG. 12 is a block diagram depicting the semiconductor memory according to the sixth embodiment. In the case of the first to fourth embodiments, the replacement address is set in advance based on the operation mode when the semiconductor memory is designed, and is written to a register. In the case of the sixth embodiment, on the other hand, the system where the semiconductor memory is installed is dummy-operated, including access to the semiconductor memory, and an appropriate replacement address is automatically set by monitoring this dummy operation. Therefore an optimum replacement address can be independently set based on the mode when the semiconductor memory is used by the user.

As the configuration in FIG. 12 shows, the defective address and replacement address setting circuit 24 are provided, and this defective address and replacement address setting circuit 24 controls testing by the test circuit 12, instructs the dummy operation to the system, and automatically detects the optimum replacement address by monitoring the addresses and synchronization signals HSYNC and VSYNC during the dummy operation. And the detected replacement address RAdd is written to the replacement address register RG2. If a defective bit is not detected, the defective address and replacement address setting circuit 24 outputs the inhibit signal INH, and forcibly sets the select signal to the second selector sel2, which replaces the addresses of the defective address and the replacement address, to the supply address SADD side via the AND gate 28. By this, the above mentioned address replacement processing is not performed if no defective bits exist. When no defective bits exist, however, there is not problem even if the above replacement address processing is performed. The rest is the same as the first embodiment in FIG. 3.

Figure 13:
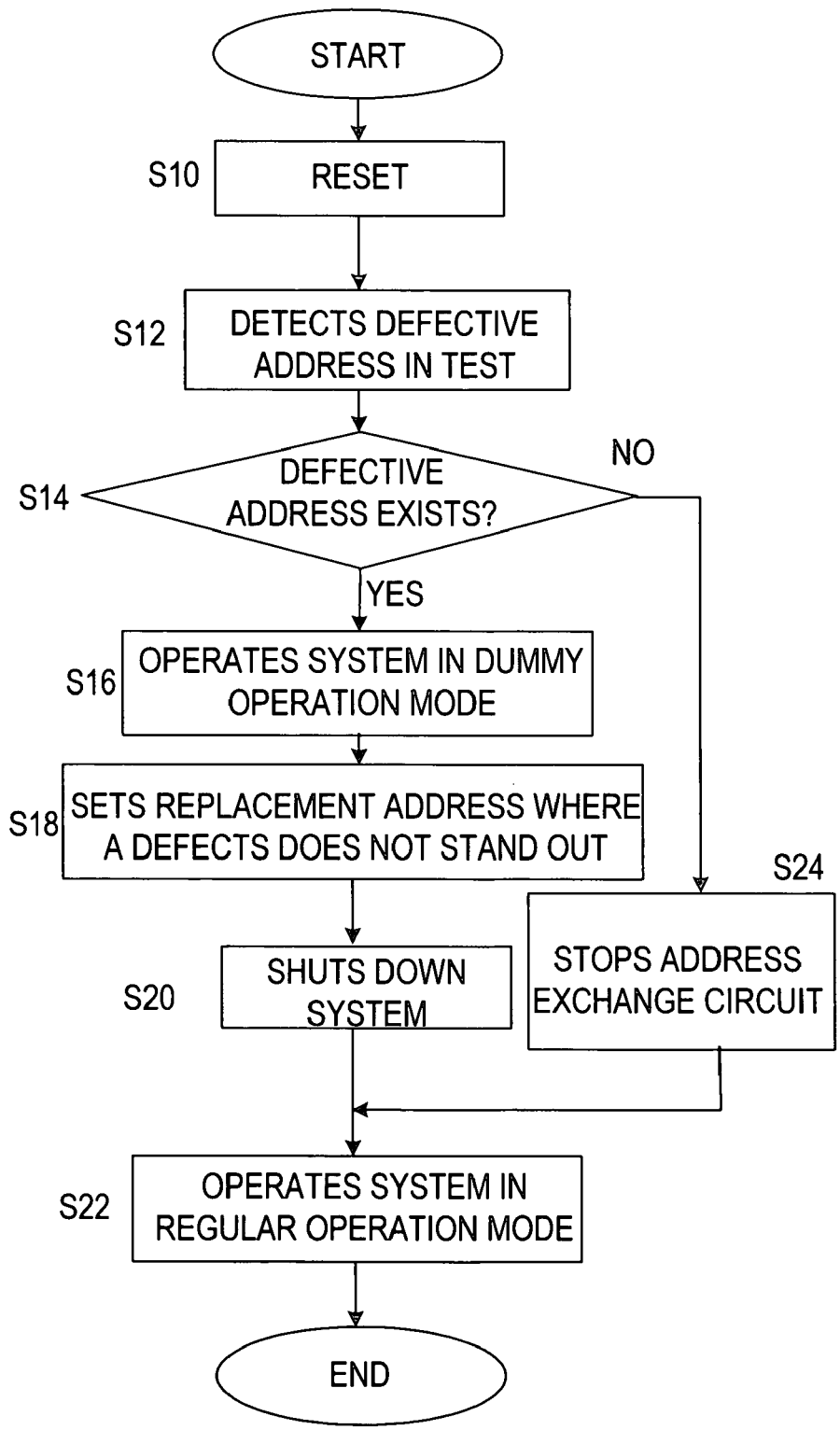
FIG. 13 is a flow chart depicting the replacement address setting operation according to the sixth embodiment.

FIG. 13 is a flow chart depicting the replacement address setting operation according to the sixth embodiment. When the reset signal RST is generated at power ON and the reset status is cleared (S10), the test circuit 12 performs an operation test of the memory unit 2 by the test operation mode signal TEST. The operation test is also described above. By monitoring the judgment signal JUG and the test address TADD, generated by the test circuit 12 during this operation test, the defective address and replacement address setting circuit 24 detects the defective address DAdd of the defective bit (S12). And if a defective address does not exist (NO in S14), the defective address and replacement address setting circuit 24 asserts the inhibit signal INH, and stops the address exchange function of the second selector sel2 (S24).

If a defective address exists (YES in S14), the defective address and replacement address setting circuit 24 asserts the dummy operation mode signal DMY, and has a higher system execute the dummy operation (S16). During the dummy operation, the active signal ACTV is set such that the output from the semiconductor memory (output from the memory control circuit, which is not illustrated) is disabled. This dummy operation is an operation to write (download) or read several frames of image data to/from the memory unit 2. In this dummy operation, the higher system generates the horizontal synchronization signal HSYNC or the vertical synchronization signal VSYNC attached to the image data. By monitoring these synchronization signals and the supply address SADD, the defective address and replacement address setting circuit 24 detects the address of the memory cell where the data of which defect is practically allowed, out of the image data, is stored (S18).

Specifically it is expected that data at the edge of image data is stored in addresses near the timing where these synchronization signals match. Therefore it is preferable to set the supply address SADD at such timing as the replacement address RAdd. Another example is that when a subtitle is included in the image, the subtitle is normally at the bottom of the regular image area, so by monitoring the horizontal synchronization signal HSYNC and the supply address SADD, the supply addresses before and after the horizontal synchronization signal are set to the replacement addresses. In other words, the addresses where data at both ends of the image are stored are set to the replacement addresses. As a result, an address, where image data corresponding to the subtitle is stored, being set to the replacement address can be prevented.

In this way, an address of data where a defect is practically allowed, specifically data where a defect is not outstanding in the case of image data, for example, is set to the replacement address. When the setting of the replacement address ends, the dummy operation mode signal DMY is cleared once, and the system is shut down (S20). Then the active signal ACTV is set to output enabled status, and the system is set to operation enabled status in regular operation mode (S22).

In the sixth embodiment, time for the dummy operation is required. However in a hard disk device, local network device or DVD device, for example, a predetermined period of wait time is required at startup after power ON. So it is preferable to perform the dummy operation using such a wait time at startup.

Figure 14:
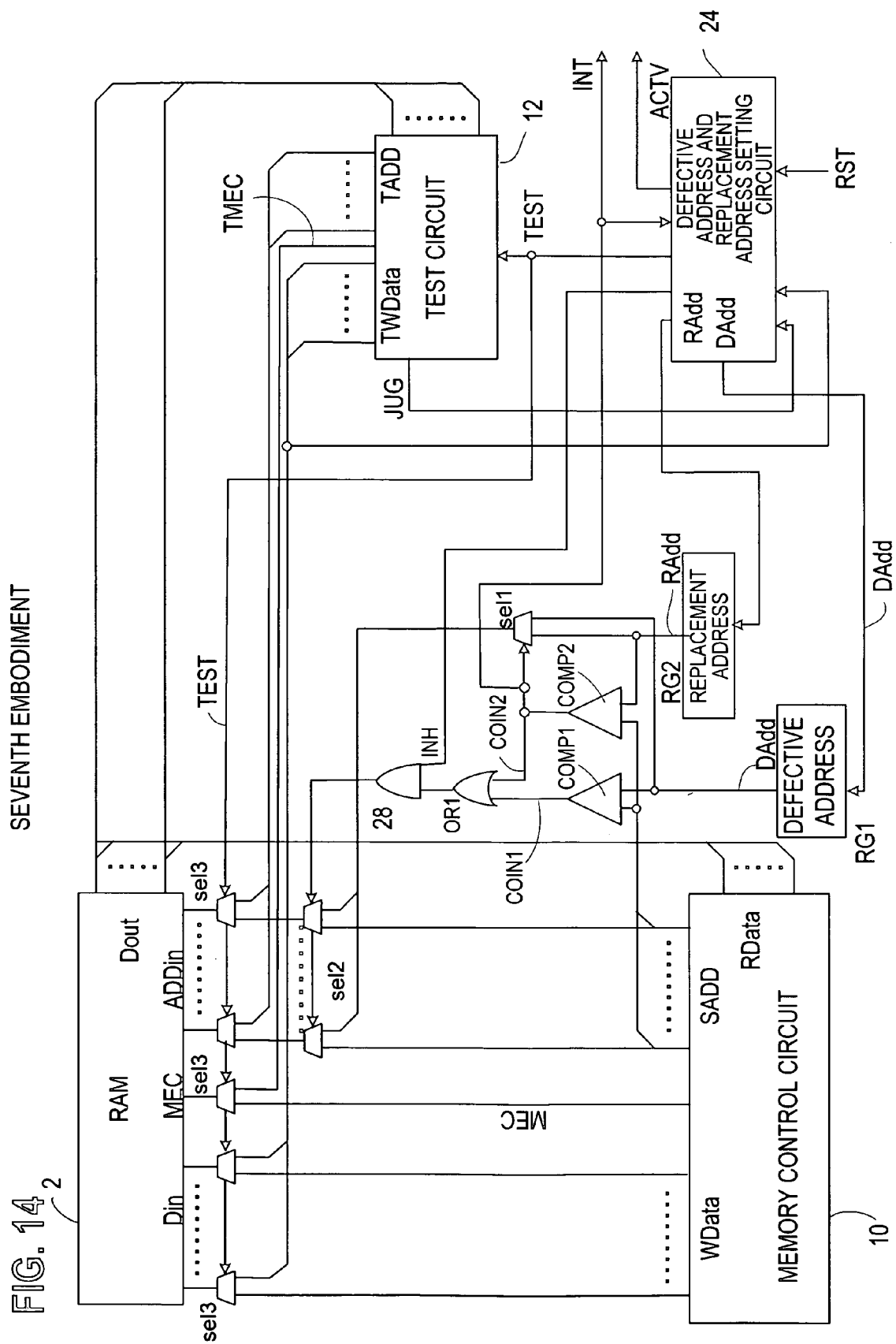
FIG. 14 is a block diagram depicting the semiconductor memory according to the seventh embodiment.

FIG. 14 is a block diagram depicting the semiconductor memory according to the seventh embodiment. In this semiconductor memory, the operation is monitored while the semiconductor memory is installed in the system, and the replacement address is detected and set, just like the case of the sixth embodiment. For the replacement address here, however, an address of a memory cell not in use, where the system did not write data, is detected.

The configuration of this semiconductor memory includes the defective address and replacement address setting circuit 24, just like the sixth embodiment in FIG. 12, and this setting circuit 24 detects a defective address by controlling the test operation of the test circuit 12, and sets the defective address in the defective address register RG1. The setting circuit 24 also has the system perform operation including access to the semiconductor memory, detects an address in a memory cell not in use, and sets it in the replacement address register RG2 as the replacement address.

The defective address and replacement address setting circuit 24, however, does not monitor the supply address SADD during system operation, but monitors the coincidence signal COIN2 for indicating whether the supply address SADD matches the replacement address RAdd, so as to check whether the temporarily set replacement address RAdd matches the address of a memory cell not in use by detecting whether access to the temporarily set replacement address RAdd is generated. If the temporarily set replacement address RAdd is not accessed during system operation throughout a predetermined period including the initialization of parameters and variables, it is judged that the temporarily set replacement address RAdd is the address of a memory cell not in use, so the replacement address RAdd is determined.

The above mentioned coincidence signal COIN2 is output as an interrupt signal INT, which instructs the system to stop operation. Unlike the sixth embodiment, the active signal ACTV here is a signal for enabling the operation of the system.

Figure 15:
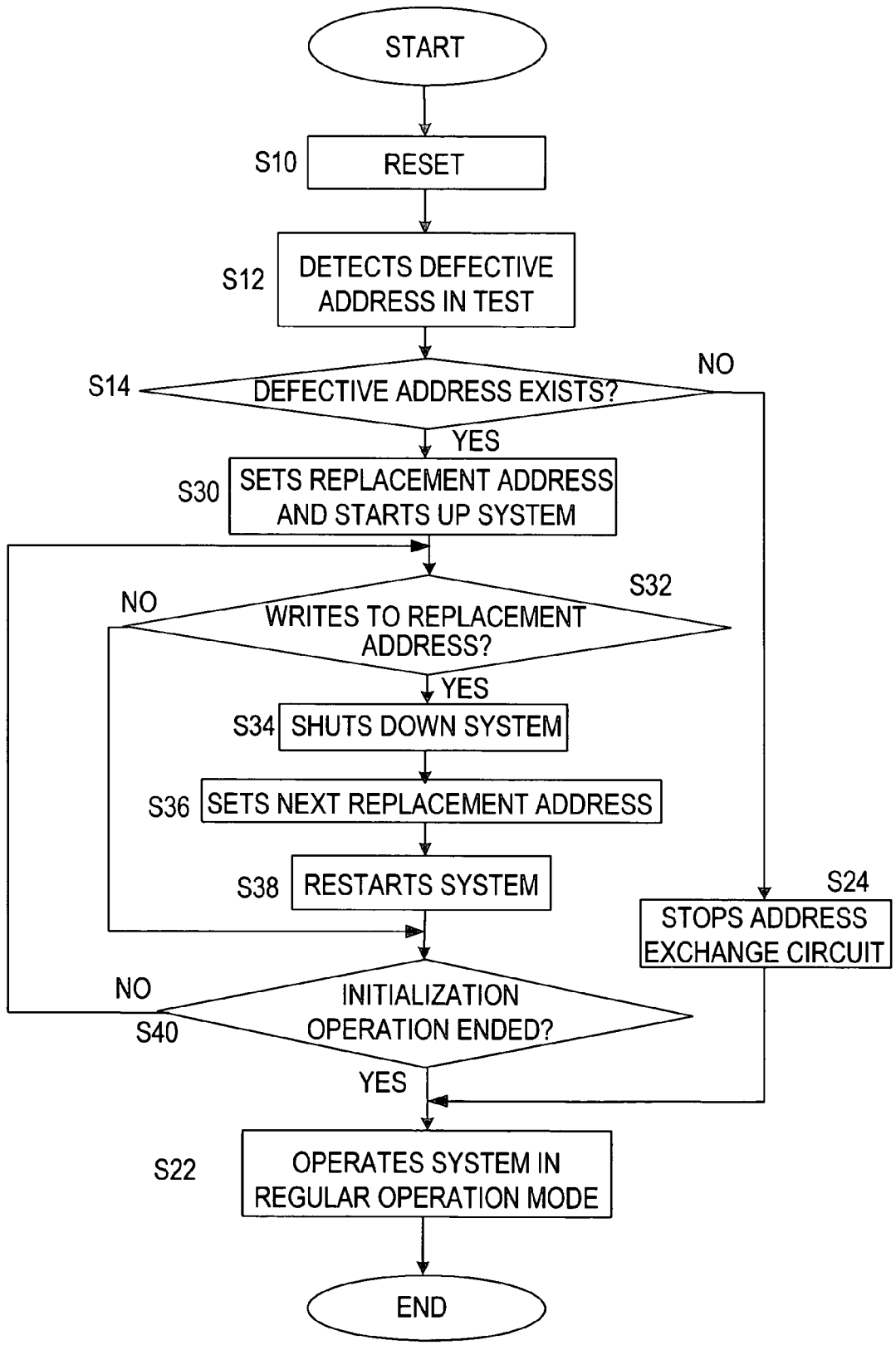
FIG. 15 is a flow chart depicting the replacement address setting operation according to the seventh embodiment.

FIG. 15 is a flow chart depicting the replacement address setting operation according to the seventh embodiment. The same steps in FIG. 13 are denoted with the same reference numbers. And if reset is cleared (S10), the defective address and replacement address setting circuit 24 detects the defective address by the operation test (S12). If defective addresses do not exist, the defective address and replacement address setting circuit 24 asserts the inhibit signal INH, switches the second selector sel2 to the supply address side, and stops the address exchange function (S24).

If a defective address is detected (NO in S14), the defective address and replacement address setting circuit 24 temporarily sets the replacement address RAdd in the replacement address register RG2, and asserts the active signal ACTV to startup the system (S30). By this, the system starts initialization operation at reset. The initialization operation includes access to the semiconductor memory, such as downloading of a program to the memory unit 2, and writing variables and parameters to the memory unit 2.

During this system operation, the defective address and replacement address setting circuit 24 monitors the coincidence signal COIN2 of the second comparator COMP2, and checks whether the system writes to or reads from the temporarily set replacement address RAdd (S32). When the initialization operation ends without access to the replacement address (YES in S40), the defective address and replacement address setting circuit 24 determines that the temporarily set replacement address is an address of a memory cell which is not in use, and ends the replacement address setting process. Then the system is started up in regular operation mode (S22).

When access to the temporarily set replacement address is detected during initialization operation, the defective address and replacement address setting circuit 24 either clears the assertion of the active signal ACTV or supplies the coincidence signal COIN2 to the system an the interrupt signal INT to stop operation of the system (S34). And the setting circuit 24 temporarily sets another replacement address in the register RG2 (S36), and either asserts the active signal ACTV again or clears the assertion of the interrupt signal INT to restart the system (S38). These steps S32-S38 are repeated until the system initialization operation ends (S40).

And the replacement address RAdd, which is temporarily set when the system initialization operation ends, becomes the finally set replacement address RAdd. This replacement address is an address which was never accessed during the system initialization operation, and is appropriate as a replacement address to be exchanged with the defective address.

In this way, the defective address and replacement address setting circuit 24 temporarily sets a replacement address, and monitors whether the replacement address is accessed or not, and sets another candidate if accessed. By repeating this operation, the replacement address can be searched and detected.

FIG. 16 are diagrams depicting the temporary setting of the replacement address according to the seventh embodiment. In the seventh embodiment, an address of the memory cell which is not in use is searched. For this, it is preferable to temporarily set the replacement address by selecting the addresses in the sequence of having a higher probability to be not used.

(A) of FIG. 16 shows the case when the memory capacity is a power of 2, where the address space of the memory RAM is from the least significant address "0000 . . . 0" to the most significant address "1111 . . . 1". In this address space, it is most likely that the most significant address is not used. As a method to allocate the address space of the memory, necessary data and program storage areas are often allocated to an area divided based on the significant bit of the address. Therefore the address space is divided into a plurality of areas, and it is likely that the most significant address of each divided area is also not used.

So in the case of (A) of FIG. 16, priority in the temporary setting of the replacement address is assigned to the most significant address "1111 . . . 1" as No. 1, the most significant address "0111 . . . 1" in the lower address area when the address space is divided into 2 as No. 2, the most significant address "1011 . . . 1" of the higher address area when the address space is divided into 4 as No. 3, and for the rest, priority is assigned to the illustrated positions. And temporary setting of the replacement addresses is performed in the sequence of priority. In other words, priority is sequentially assigned to the most significant address in an area of a higher address of a plurality of areas when the memory space is divided into 2, 4 or 8. By this, the search process of the replacement address can be minimized.

(B) of FIG. 16 shows the case when the memory capacity is not a power of 2 and the address space is the least significant address "0000 . . . 0" to the most significant address "110x . . . x". In this case, the priority of the temporary setting of the replacement address is assigned to the most significant address as No. 1, and then in the same way as (A) of FIG. 16, the priority is assigned to the most significant address of an area when the memory space is divided into 2, 4 and 8 respectively.

In the sixth and seventh embodiments, the defective bit position may be detected as the third embodiment, and the bit exchange of write data or read data may be performed when the address of the defective bit is accessed.

What is claimed is:

1. A semiconductor memory, comprising:
a memory unit including a regular cell array having a plurality of memory cells and a decoder for decoding an input address and selecting a memory cell corresponding to the input address in the regular cell array, in which an access operation is performed to the selected memory cell;
a defective address storage section which stores a defective address corresponding to a defective bit in the regular cell array; and
a replacement address storage section which stores a replacement address corresponding to a replacement bit in the regular cell array, wherein
when a supply address supplied to the memory unit matches the defective address, the replacement address, in place of the supply address, is supplied to the memory unit as the input address, and the decoder decodes the replacement address so as to select a memory cell corresponding to the replacement address in the regular cell array, and
when an image data is stored in the regular cell array, the replacement address to replace the defective address is set to an address corresponding to a memory cell which stores said image data of an edge area of an image.

2. The semiconductor memory according to claim 1, wherein when the supply address matches the replacement address, the defective address, in place of the supply address, is supplied to the memory unit as the input address, and the decoder decodes the defective address so as to select a memory cell corresponding to the defective address in the regular cell array.

3. The semiconductor memory according to claim 1, wherein the replacement address of the replacement bit to be accessed, instead of the defective bit, is selected from the addresses of the memory cells where data, in which the presence of defects is practically allowed based on the data type stored in the semiconductor memory, are stored.

4. The semiconductor memory according to claim 1, wherein the replacement address of the replacement bit to be accessed instead of the defective bit is selected from the addresses of the memory cells where data in the regular cell array is not written.

5. The semiconductor memory according to claim 4, further comprising a replacement address setting unit which monitors an input address to be accessed when a write operation to the semiconductor memory is performed, and set an address, where writing has not been performed, to be the replacement address.

6. The semiconductor memory according to claim 5, wherein the replacement address setting unit detects an address of a memory cell where writing has not been performed when data are downloaded to the semiconductor memory, and stores the detected address in the replacement address storage section.

7. The semiconductor memory according to claim 1, wherein
the memory unit writes or reads a plurality of bits of data corresponding to an input address, and
the semiconductor memory further comprises a bit exchange circuit which exchanges a defective bit for a non-defective predetermined bitT among the plurality of bits of write data or read data that correspond to the defective address.

8. The semiconductor memory according to claim 7, wherein the predetermined bit is a least significant bit.

9. The semiconductor memory according to claim 2, further comprising a selector which selects the replacement address or the defective address, in place of the supply address, for being supplied to the memory unit.

10. The semiconductor memory according to claim 9, further comprising a first comparator which detects a match of the supply address and defective address, and a second comparator which detects a match of the supply address and replacement address, wherein
the selector selects the replacement address when the first comparator detects a match, and selects the defective address when the second comparator detects a match.

11. The semiconductor memory according to claim 1, further comprising a test circuit which performs an operation test of the memory unit, and detects the address of the defective bit.

12. A semiconductor memory, comprising:
a memory unit including a regular cell array having a plurality of memory cells and a decoder for decoding an input address and selecting a memory cell corresponding to the input address in the regular cell array, in which an access operation is performed to the selected memory cell and a plurality of bits of data are written or read according to the input address;
a defective address storage section that stores a defective address corresponding to a defective bit in the regular cell array; and
a bit exchange circuit that exchanges the defective bit for a non-defective predetermined bit among the plurality of bits of write data or read data that correspond to the defective address
wherein said plurality of bits of write data or read data is data including bits from a least significant bit to most significant bit and
when an image data is stored in the regular cell array, the plurality of bits of write data or read data is data corresponding to an edge area of image.

13. The semiconductor memory according to claim 12, wherein the predetermined bit is said least significant bit.

* * * * *